(12) United States Patent
Lewyn

(10) Patent No.: US 6,417,736 B1
(45) Date of Patent: Jul. 9, 2002

(54) MULTIPLE-VOLTAGE SUPPLY POWER AMPLIFIER WITH DYNAMIC HEADROOM CONTROL

(75) Inventor: Lanny L. Lewyn, Laguna Beach, CA (US)

(73) Assignee: Lewyn Consulting, Inc., Laguna Beach, CA (US)

( * ) Notice: Subject to any disclaimer, the term of this patent is extended or adjusted under 35 U.S.C. 154(b) by 28 days.

(21) Appl. No.: 09/704,452

(22) Filed: Nov. 1, 2000

(51) Int. Cl.[7] .............................................. H03F 3/04
(52) U.S. Cl. ...................................... 330/297; 330/267
(58) Field of Search ................................ 330/267, 268, 330/297

(56) References Cited

U.S. PATENT DOCUMENTS

| | | | | |
|---|---|---|---|---|
| 3,376,388 A | * | 4/1968 | Reiffin | 179/1 |
| 5,510,754 A | * | 4/1996 | Moraveji et al. | 330/267 |
| 5,942,941 A | * | 8/1999 | Corsi et al. | 330/255 |
| 6,236,273 B1 | * | 5/2001 | Lewyn | 330/297 |

* cited by examiner

Primary Examiner—Benny Lee
Assistant Examiner—Henry Choe
(74) Attorney, Agent, or Firm—Jeffrey Slusher

(57) ABSTRACT

A monolithic integrated circuit amplifier has a gain stage and a buffer stage. The buffer stage includes an output stage and two separate voltage supplies, the second of which has a greater magnitude than the first. Switching circuitry is included that is connected to the output stage via a regulator bus. When an output demand voltage is less than a switch-over threshold, current to the output stage is provided substantially from the first voltage supply; when the output demand voltage is greater than the switch-over threshold, current to the output stage is provided substantially from the second voltage supply. Collector voltage at the output stage is dynamically controlled to be greater than the emitter voltage by a difference voltage that increases proportionally as output voltage increases above the switch-over threshold. This difference voltage is commonly referred to as "headroom." The dynamic headroom control circuitry preferably includes means for predictably setting and controlling the headroom voltage at switch-over and smoothly increasing the headroom voltage up to maximum output voltage.

16 Claims, 6 Drawing Sheets

Input
Input Gain Stage

Unity-gain
Output buffer stage

MULTIPLE-VOLTAGE SUPPLY POWER AMPLIFIER WITH DYNAMIC HEADROOM CONTROL

BACKGROUND OF THE INVENTION

1. Field of the Invention

This invention relates to power amplifiers and more particularly to high-power, monolithic, integrated circuit (IC) power amplifiers.

2. Background Art

Certain telecommunications standards have been developed in the United States to provide high-speed digital access between customers and a central office. One example is the Asymmetric Digital Subscriber Loop (ADSL) standard, which provides a data rate of approximately 6 Mb in the direction from the central office to the customer. As a result of the high data rate, ADSL has become one of the preferred standards for supplying Internet service over a standard copper wire twisted pair.

Although it offers a high data rate, the ADSL standard requires that the line-driving amplifier at the central office be able to supply a signal of approximately 20 dBm (power with respect to a reference level of 1 mW) in power with a peak-to-rms average voltage ratio (PAR) of 5.33:1. In order to accommodate the required power output level and PAR, two line-driving amplifiers, or a line-driver pair, are commonly used in a bridge configuration with a 1:2 step-up transformer between the amplifiers and the line.

One disadvantage of this conventional arrangement is its need for power as the number of customers grows. In the near future, for example, it is expected that several thousand customers may require ADSL service from the same central office. The possibility of expending several kilowatts of power just to operate the ADSL line-drivers has therefore become a major concern regarding this type of digital service. Much research effort has therefore been applied to the problem of increasing the efficiency of monolithic, integrated circuit (IC) power amplifiers for ADSL applications.

In one known circuit arrangement, the output stage of an operational amplifier is connected to an approximately constant supply voltage that is greater in magnitude than the maximum zero-to-peak output voltage. The amount by which the supply voltage exceeds the maximum output voltage is commonly known as the voltage headroom required for the stage. For example, a typical value for the voltage headroom in prior art circuits is 3V. The zero-to-peak voltage for an ADSL amplifier in the central office is approximately 8.42V. The minimum power supply voltage for such an arrangement would therefore be approximately 11.42V. The supply voltage, given some initial voltage setting inaccuracy, may therefore be nominally 12V.

Because the average current required from each power supply (+/−12V) in the amplifier pair is approximately 28.5 mA for the ADSL central office, the minimum power possible for a 12V supply would be 4×12V×28.5 mA =1.36 W. This would be the minimum power given ideal "Class C" operation of the output stage and without providing additional power for any amplifier current bias circuits. Because ADSL power amplifiers require low output distortion—typically better than 70 dB for signal to noise-and-distortion ratios—"Class C" operation is not practical. It is therefore understandable why, despite considerable efforts, many manufacturers have not been possible to reduce power consumption for ADSL central office line driving amplifier pairs significantly below 1.5 W.

One known method for reducing power consumption is the elimination, or substantial reduction, in the value of the load-matching termination resistor that is usually included in the circuit. Several circuits have been described in the technical literature that use using active electronic circuits to emulate the effect of the termination resistor, and thereby allow its value to be reduced by as much as a factor of 10. These circuit combinations may be driven by a conventional driver with 8.5V peak output voltage, but transformer ratios closer to 1:1 allow a significant reduction in peak currents for output drivers in the central office. Such circuits are capable of achieving power levels in the range close to 1 watt.

Another possibility for reducing driver output power is commonly described as "Class G" operation. In Class G, the output stage is switched from a lower to a higher voltage supply when output voltage demand is high. If the output driver can be supplied with current from the lower supply for a major fraction of the output waveform, a significant power savings can result. On the other hand, if the switching is done abruptly, significant voltage transients may arise on the supply terminals of the output driver device. This in turn results in increasing noise and distortion components well beyond acceptable limits.

The object of a co-pending application by the present inventor is to reduce switching transients in the output driver supply voltage by providing a linear power switching circuit that operates to maintain a nearly constant headroom, that is, difference between the voltage supply terminal and signal power output terminal, in the output power driver. Unfortunately, the capability of supplying nearly a constant headroom over the entire dynamic output range implies providing as much headroom at the lower switch-over voltage as at the higher maximum output driver voltage.

A very large area bipolar driver transistor pair might only require approximately 800 mV of headroom at maximum output current, but the pair might be so large that is precludes integration with more than one, and possibly up to four other driver transistor pairs on a single bipolar integrated circuit. By providing more headroom, 1.5V for example, at maximum output, it would be possible to tolerate a larger collector resistance and allow construction of each driver using significantly less chip area.

Unfortunately, a circuit that provided a constant headroom for the output driver of 1.5V and also consumed an additional 0.5V of headroom for the power switch could provide a maximum switch-over voltage of only about 3V. Because of the shape of the normal probability distribution for the ADSL signal statistics, a driver with a switch-over voltage of 3V and a maximum voltage of 9V, for example, would require that four times more of the output duty cycle must be supplied from the inefficient, high voltage supply than would a driver with a switch-over voltage of 4V.

What is needed is therefore an arrangement that provides less headroom at switch-over and more headroom at maximum output, with predictable dynamic headroom voltage control over the whole signal output range. Minimizing headroom at crossover and providing considerably more, but carefully controlled, headroom that increases to maximum output would make possible a significant reduction in the power consumed by the amplifier and also minimize the layout area required by the high-current output devices. The combination of low power dissipation and low integrated circuit areas is essential to achieving higher than present levels of integration in bipolar output drivers for telecommunications applications. This invention provides such an arrangement.

SUMMARY OF THE INVENTION

In the amplifier according to the invention, collector voltage at the output stage is dynamically controlled to be greater than the emitter voltage by a difference voltage that increases proportionally as output voltage increases above the switch-over threshold. This difference voltage is commonly referred to as "headroom." The dynamic headroom control circuitry preferably includes circuitry for predictably setting and controlling the headroom voltage at switch-over and smoothly increasing the headroom voltage up to maximum output voltage. Providing low headroom at switch-over is a key to achieving high power efficiency and low power dissipation. Providing increased headroom at maximum voltage output is a key to reducing the integrated circuit area required by the high current output drivers.

A monolithic integrated circuit amplifier according to the invention has an input signal and an output signal, as well as a gain stage. The gain stage has a gain stage output signal and, as an input, the amplifier input signal. A buffer stage produces an amplifier output signal and has, as its input signal, the gain stage output signal. A driver output stage, included within the output buffer stage, has at least a first power output transistor.

First and second voltage supplies are included, the second voltage supply having a relatively higher magnitude than the first. A first power control circuit is connected to both the first and second voltage supplies, and to the driver output stage through a regulator bus. The first power control circuit includes first and second switching circuits connected to the first and second voltage supplies, respectively. Outputs of the first and second switching circuits are both connected to the regulator bus; these outputs are preferably and respectively one terminal of a diode and the emitter of a bipolar (or MOS equivalent) transistor. The diode may be of conventional PN junction silicon-diode construction or may preferably be a Schottky diode.

When an output demand voltage is less than a predetermined switch-over threshold, current to the driver output stage is provided substantially entirely from the first voltage supply via the first switching circuit and the regulator bus. When the output demand voltage is greater than the switch-over threshold, current to the output driver stage is provided substantially entirely from the second voltage supply, via the second switching circuit and the regulator bus.

When in a first mode of operation, the first switching circuit is conducting and supplying the current to the output driver stage, the voltage on the regulator bus itself blocks current output from the second switching circuit.

When in a second mode of operation, the second switching circuit is conducting and supplying the current to the output driver stage, the voltage on the regulator bus itself blocks current output from the first switching circuit.

In the preferred embodiment of the invention, the first and second voltage supplies comprise a first dual voltage supply. The regulator bus connecting the first dual voltage supply to the power amplifier output via a first power control circuit is thereby a first regulator bus. The amplifier then preferably further includes a second dual voltage supply, including third and fourth voltage supplies having the same amplitudes but opposite polarity relative to the first and second voltage supplies, respectively; and a second power control circuit having the substantially identical components and connections but opposite polarities relative to the first power control circuit. The invention then further includes, in the buffer stage, a common output voltage terminal for both power control circuits.

For each power control circuit, there is then preferably provided: a driver output transistor that has an emitter, a collector, and a base (or MOS equivalents); an optional output resistor connected between the emitter of the output transistor and the voltage output terminal; and an emitter-follower transistor connected to the respective second voltage supply and forming an emitter-follower driver circuit for the output transistor.

According to one aspect of the invention, in a second mode of operation, the voltage at the collector (or MOS equivalent) of the driver output transistor is dynamically controlled to be greater than the voltage at the emitter (or MOS equivalent) of the driver output transistor by an amount that increases as the driver output stage voltage delivered to the load increases. This provides increased headroom voltage for the driver output transistor in order to maintain the transistor just above saturation as the demand for output current increases.

According to yet another aspect of the invention, in a first mode of operation, the voltage at the collector (or MOS equivalent) of the driver output transistor may be dynamically controlled to be greater than the voltage at the emitter (or MOS equivalent) of the transistor by a minimum amount that is approximately equal to one diode drop. This prevents substantial forward biasing of the base-collector diode and large parasitic capacitances that would otherwise result from such a forward biased condition.

According to yet another aspect of the invention, the transition from the first to second mode of operation occurs at a relatively high driver output voltage or low driver output driver transistor collector-to-emitter voltage. This is because, at the lower-than-maximum output currents occurring at this transition, large collector-to-emitter voltage is not required. The collector-to-emitter voltage is adjustable to be maintained just greater than a diode drop at the transition and is capable of rising to a few volts at full output.

The last mentioned aspect of the invention is particularly advantageous, because output power efficiency increases in proportion to the fraction of the duty cycle over which the circuit is in the first mode of operation. When the transition can occur at a relatively higher output voltage, that duty cycle fraction is relatively higher than would be the case with a lower transition voltage.

In the preferred embodiment of the invention, with the first voltage supply set, for example, to +/−5V and the second voltage supply set to +/−12V the switch-over voltage may be approximately 4V, giving a maximum voltage of approximately 9V.

Because the maximum voltage in an ADSL signal is 5.33 times its standard deviation, a switch-over voltage of only 3V would correspond to approximately 1.77 times the signal standard deviation. A randomly distributed ADSL signal exceeds 1.77 times it standard deviation for approximately 8 percent of its duty cycle.

By comparison, a switch-over voltage of approximately 4V corresponds to approximately 2.3 times the signal standard deviation. The normal probability statistics of a randomly distributed ADSL signal are such as to cause the fraction of the total duty cycle to drop sharply as the switch-over voltage is increased, to approximately 2 percent, for the fraction of the duty cycle that the switch-over voltage was exceeded.

The significant power savings made possible by realizing a duty cycle substantially less than 8 percent, when combined with active load termination methods, enable driver power levels for ADSL below 500 mW. Moreover, a combined package power dissipation limit of approximately 2 watts makes it possible to combine as many as four line drivers in a single package. The present invention therefore represents enabling technology that will allow the construction of quad ADSL integrated-circuit line drivers.

DETAILED DESCRIPTION

Figure 1A:
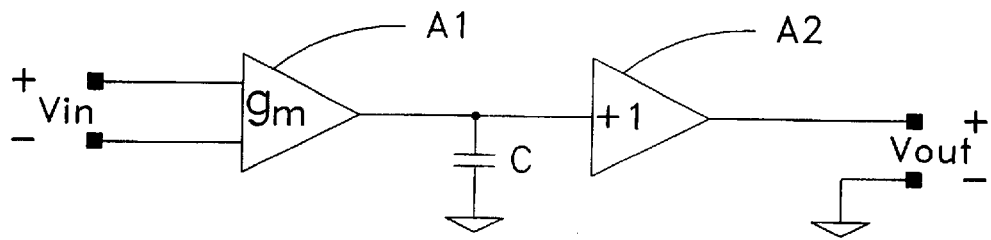
FIG. 1A is a greatly simplified illustration of a bipolar monolithic operational amplifier with a unity-gain output buffer stage.

First, the major functional aspects of the invention are described below to provide the reader with an overview that, it is hoped, will be helpful when studying the detailed circuit diagram of the preferred embodiment of the invention. Second, the general structure of three power amplifiers according to the prior art are briefly discussed. Third, the general structure of the multiple-voltage-supply power amplifier with dynamic headroom control according to the invention is described. Fourth, one actual circuit implementation of the preferred embodiment of the invention is described in detail.

Major Functional Aspects of the Invention

The invention reduces power levels for a high-power, monolithic, IC amplifier pair to below 1.0 W through an approach that allows the current to the load to be provided most of the time, that is, with a high duty cycle, from a pair of first, lower-voltage supplies (such as, for example, +/−5V). A second pair of higher-voltage supplies (such as, for example, +/−12V) provides the current to the load for only that small fraction of the operating duty cycle when the load voltage zero-to-peak value exceeds a predetermined switch-over threshold, for example, approximately 4 V. Here, "higher" and "lower" mean greater or smaller supply voltage magnitude.

The invention includes a first and a second power control circuit that work in combination with a driver output stage circuit to minimize the excess voltage headroom required at the switch-over threshold. The switch-over between the first and second voltage pairs occurs at a reasonably high fraction of the first voltage. This results in a high duty cycle for the time that the load current is provided from the first supply voltage.

According to one aspect of the invention, the switch-over threshold is maximized by the power control circuits, which dynamically control the voltage at the collector (or MOS equivalent) of each driver output transistor so as to keep it greater than the voltage at the emitter (or MOS equivalent) of the driver output transistor by an amount that increases as the driver output stage voltage delivered to the load increases. The amount by which the collector voltage exceeds the emitter voltage is known as the output stage "headroom." The headroom should be large at maximum output voltages and drive currents, but may be significantly smaller at lower output voltages such as the switch-over threshold voltage.

The power control circuits adjust the headroom required by each driver output stage dynamically to be just that required over the dynamic range of operation from switch-over voltage to maximum output. This minimizes the headroom required at switch-over and maximizes the driver stage voltage output at switch-over.

The power control circuit may include a voltage-shifting diode and resistor combination that sets the minimum headroom for the driver output transistor, which is approximately equal to one conventional silicon diode drop. This prevents substantial forward biasing of the transistor base-collector diode and the large parasitic capacitances that might otherwise result from such a forward-biased condition. In the preferred embodiment of the invention, this diode is a Schottky diode, although a conventional silicon diode may be used; alternatively, the diode may be replaced by a short circuit, which eliminate the diode drop altogether.

Note that a power control circuit that did not incorporate dynamic adjustment of headroom and that operated with a fixed headroom control would have to provide as much headroom at switch-over as at maximum driver output voltage. For a 5V first, or lower-voltage supply, this might require the switch-over voltage to be fixed somewhere within the range of 3 to 3.5V. A higher switch-over voltage, such as 4V, would allow the power control circuitry to provide current over a larger portion of the duty cycle from the first, or more power-efficient voltage supply.

By maximizing driver stage output at voltage switch-over, the arrangement according to the invention wastes very little of the supply current from the second voltage supply. The invention thus minimizes the total power consumed the two power supplies and provides the enabling technology to combine more than one driver, and possibly four, within a single integrated circuit package.

Two-stage power amplifiers

FIG. 1A illustrates the general principle of a two-stage, monolithic, IC amplifier. An input gain stage comprises a first amplifier A1 with gain gm, whose input is the voltage input Vin and whose output current is, by definition, equal to (gm×Vin). The output of this input gain stage is applied as the input to a unity-gain output buffer stage, which comprises a unity-gain element A2, the output of which forms the system output Vout. A capacitor C is often included within the input gain stage to connect the output of A1 (and thus the input of A2) to circuit ground in order to provide frequency compensation and stabilization.

Figure 1B:
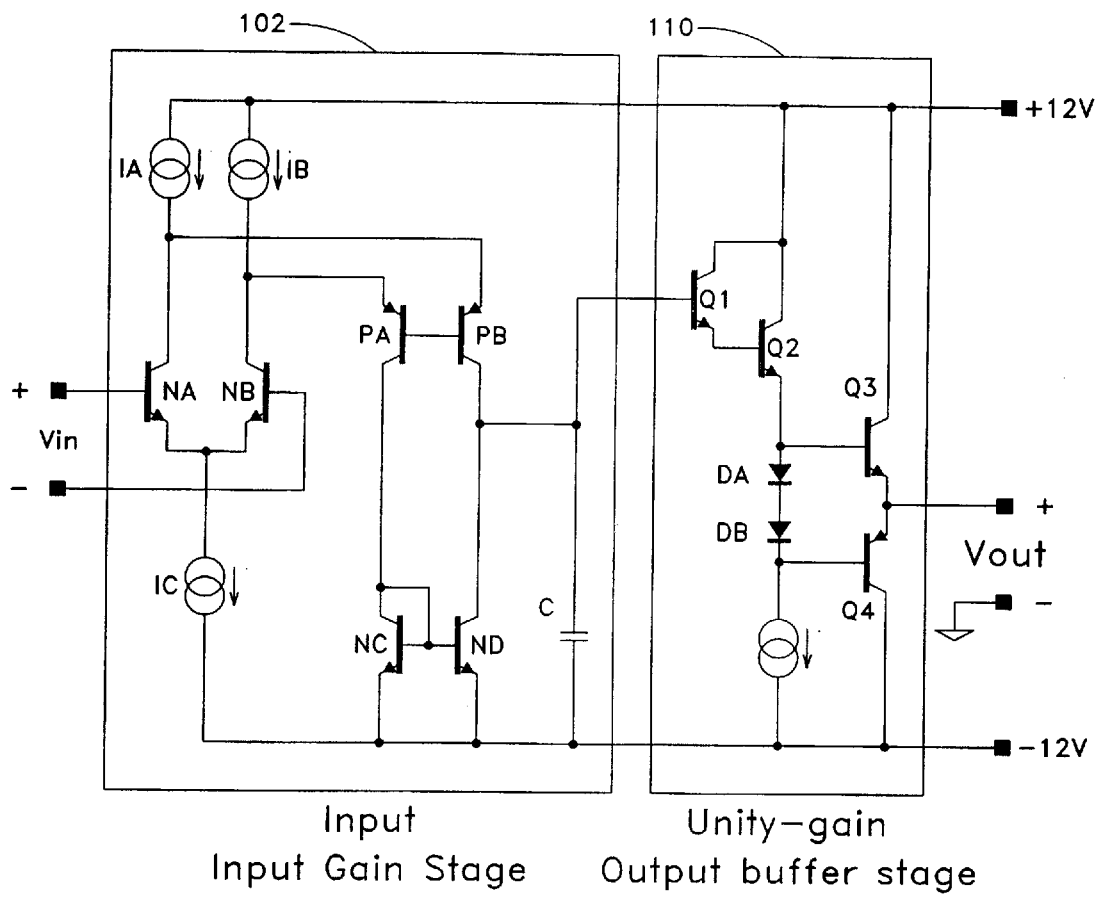
FIG. 1B illustrates one known, conventional implementation of the amplifier structure of FIG. 1A.

FIG. 1B shows a simplified design of the basic amplifier of FIG. 1A. The input gain stage 102 includes conventional current sources, current mirrors, and buffer stages. The design and operation of such an input gain stage is well known, so the various components, their connections and functions are not described in detail here. FIG. 1B also shows a simplified unity-gain output buffer stage 110. The output from the unity-gain input stage is connected to the base of the first of a pair of Darlington-coupled NPN input transistors Q1, Q2 in the output buffer stage. The collectors of these transistors are connected to a positive voltage supply of, for example, +12 V. The emitter of transistor Q2 is connected to a negative power supply of, for example, −12 V, via a pair of bias diodes DA, DB, and a current source. The diodes DA, DB are included to help reduce crossover distortion. The bases of two emitter-connected output transistors Q3, Q4 are connected on respective sides of the diodes DA, DB, and the emitter voltage of Q3, Q4 is taken as the output from the entire two-stage system.

Figure 1C:
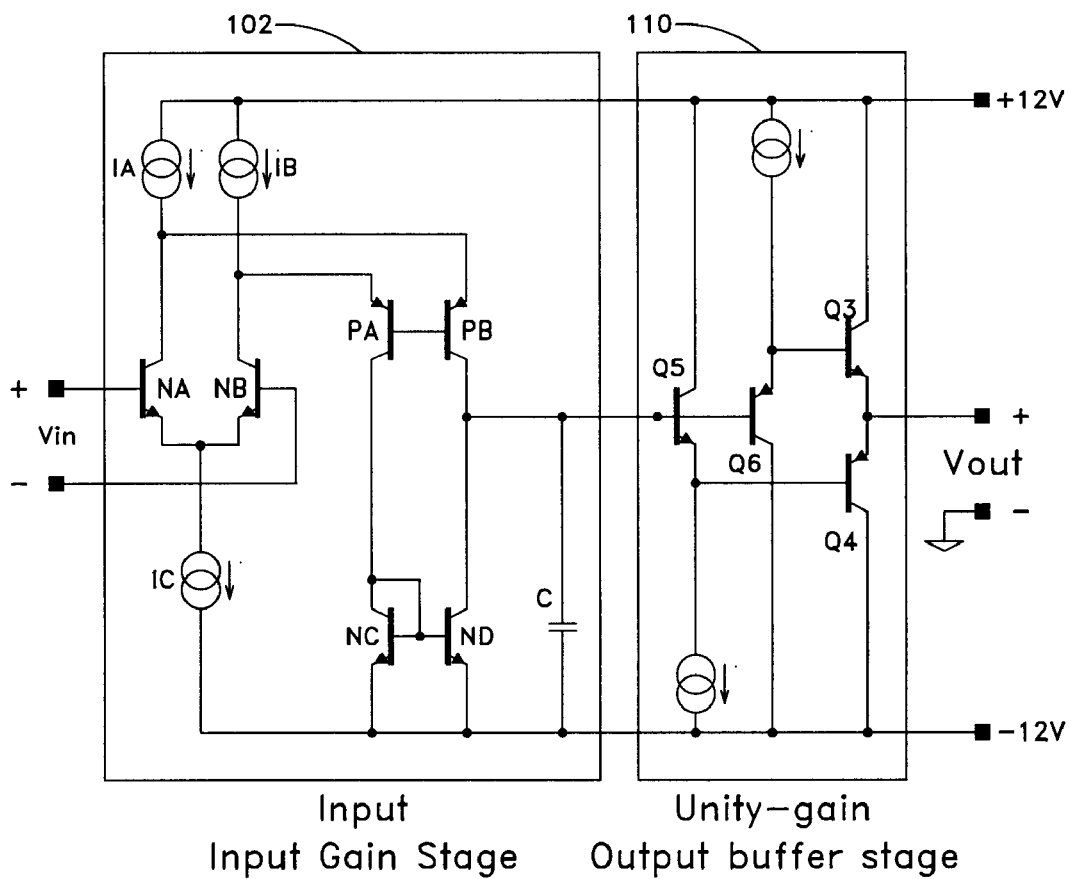
FIG. 1C illustrates another conventional implementation of the amplifier structure of FIG. 1A, but with a different implementation of the unity-gain output buffer stage.

FIG. 1C illustrates a modification of the conventional two-stage power amplifier of FIG. 1B. In this modified design, the Darlington-coupled transistors Q1, Q2 as well as the diodes DA, DB are replaced by a single pair of base-connected input transistors Q5, Q6, whose emitters are coupled to the bases of the output transistors Q4, Q3, respectively. Although this design eliminates the diodes DA, DB, it does so at the cost of including separate current sources in the emitter-to-supply paths of the input transistors Q5, Q6.

The designs shown in FIGS. 1B and 1C are well understood and are described in detail in, for example, "Bipolar and MOS Analog Integrated Circuit Design," Alan B. Grebene, John Wiley & Sons, (Wiley-Interscience Publication), 1984. They are therefore not described further here. What is important to note, however, is that in both of these conventional designs, all output current from the buffer stage is derived from a single positive supply and a single negative supply, for example, +12 V and −12 V. This leads to the disadvantages described above.

General System According to the Invention

Figure 2:
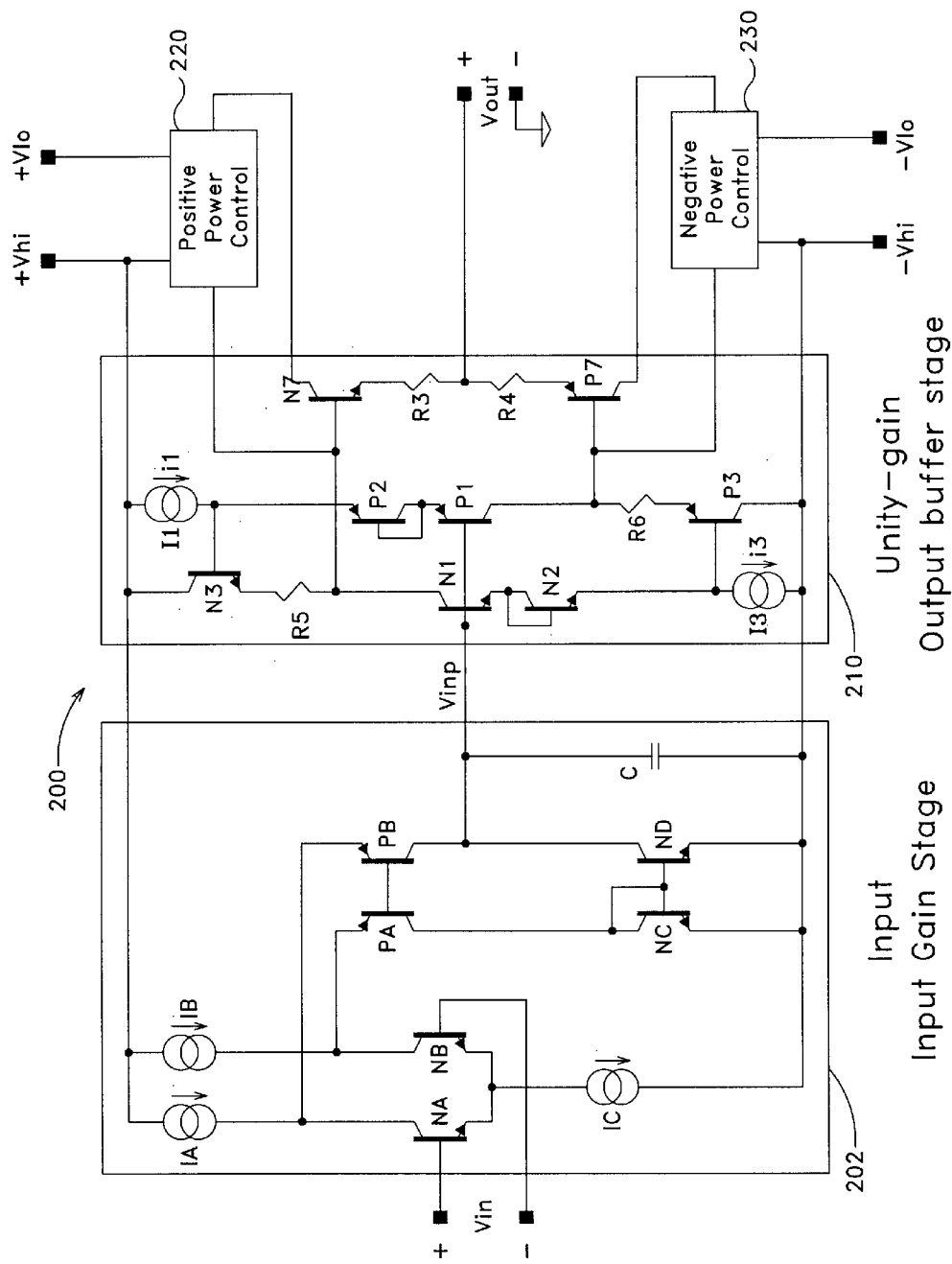
FIG. 2 is a simplified block diagram of the bipolar monolithic operational amplifier of the present invention.

FIG. 2 illustrates the major circuit sections of the two-stage, multiple-voltage-supply, monolithic, integrated circuit (IC) power amplifier according to the invention, with dynamic headroom control. The circuit as a whole, including both stages, power supplies and power control circuits 220, 230 (described below) is indicated generally by reference number 200. The invention includes an input gain stage 202, which may be designed as in any conventional circuit, for example, the input gain stages shown in either FIG. 1B or 1C. The output of the input stage 202 is connected as an input signal Vinp to an output buffer stage 210. The specifics of the output stage 210 in the preferred embodiment of the invention are discussed in greater detail below.

In most applications of the invention, the output stage is to have unity gain. This is natural, since this stage acts primarily as a buffer, and the proper amplification of the system input signal Vin can be accomplished simply by setting the gain gm of the input stage. One could also, however, design the output stage to have other than unity gain if for some reason this is desirable. The necessary design changes will be obvious to those skilled in the art of monolithic operational amplifiers.

A positive power control circuit 220, which is preferably, but not necessarily, simply implemented as part of the output buffer stage, is included to switch the driving of the positive output driver supply current between a relatively high-valued positive voltage supply +Vhi and a relatively low-valued positive voltage supply +Vlo. A negative power control circuit 230, which is analogous but of reverse polarity relative to the positive power control circuit 220, is preferably included to switch the negative output driver supply current between a relatively high-valued negative voltage supply −Vhi and a relatively low-valued negative voltage supply −Vlo.

In most embodiments of the invention, +Vhi and +Vlo have the same magnitudes as −Vhi and −Vlo, respectively. This is preferable since input signals in most applications will usually have the same positive and negative voltage ranges, but it is not required by the invention. Design changes to provide unipolar operation will be obvious to those skilled in the art of integrated circuit design.

The invention reduces the power needed to drive the amplifier by providing both high and low voltage supplies, and switching current to the higher voltage only as needed. The lower voltages +Vlo and −Vlo may also be selected using normal design considerations. In most bipolar circuitry, however, voltages of 5 V are commonly used for driving typical components. Moreover, in the most common expected application of the invention, namely, in ADSL amplification circuitry, +Vhi and −Vhi will be +12 V and −12V, respectively. These exact voltages are not required according to the invention, but will be assumed by way of example in the description of the preferred embodiment below. The maximum voltage is generally also used for the system as a whole; accordingly, +Vhi and −Vhi are connected to drive the input gain stage 202 as well. On the other hand, if for some reason a different (especially smaller) voltage range is required in the input stage than the output buffer stage, then different supply voltages may be provided.

It has been found in practice with typical ADSL applications, that the voltage demand rises high enough to require supply from the +12V source only a few percent of the time; this will generally occur only when the load voltage zero-to-peak value exceeds approximately 4V of the 9V peak value. This means that conventional systems, which use only the single +12V source, are providing high headroom voltages in order to deal with a voltage demand that does arise, but with only a small duty cycle.

Because the lower voltage supply (+Vlo, for example, +5V) may be set at less than half the voltage of the higher supply (+Vhi, for example, +12V), the power dissipated from the quiescent or idling current of the output stage is reduced by more than half. Thanks to this reduction, higher idling current may be allowed and therefore lower distortion is possible.

In the preferred embodiment of the invention, for example, with Vlo set to 5V and Vhi set to 12V the switch-over voltage is approximately 4V, for a maximum voltage of approximately 9V. Because the maximum voltage in an ADSL signal is 5.33 times the signal standard deviation, a switch-over voltage of 4V corresponds to approximately 2.37 times the signal standard deviation. The fraction that the signal exceeds a given level, or multiple of a unit standard deviation, may be determined by evaluating the normal probability integral. Such evaluation reveals that a randomly distributed ADSL signal exceeds 2.37 times its standard deviation for approximately 2 percent of its duty cycle. The line load is therefore powered from the Vhi supply for only a small fraction of the duty cycle.

By comparison, a power control circuit that is designed to provide a relatively constant headroom voltage would provide nearly the same headroom at switch-over as at maximum power level. Such a power control design might easily require an additional 1V of headroom at switch-over. In that case, a 3V switch-over voltage would be required with Vlo set at 5V and the same 9V maximum output signal. A 3V switch-over voltage would correspond to 1.77 times the signal standard deviation. Evaluation of the normal probability integral reveals that a randomly distributed ADSL signal exceeds 1.77 times its standard deviation for approximately eight percent of its duty cycle. Such a circuit would require current from the second for a portion of the output duty cycle approximately four times greater (that is, the ratio of eight percent to two percent, than is required by the present invention.

For conventional ADSL line output drivers typically requiring in excess of 1.4W of power for each and every driver pair in the central office, the power savings from supplying current from the Vhi supply for less than a few percent of the duty cycle will reduce the output driver power level by more than half, or to below 750 mW. For ADSL line drivers using active termination methods typically requiring approximately 1W of output driver power, a power reduction by more than half will reduce the output driver power to below 600 mW. A power level of 600 mW or less must be achieved to enable the integration of as many as four amplifiers on a single chip. This is because a total chip power dissipation of approximately 2.2 watts is a practical limit for combining more than one line driver in a single package without requiring the addition of costly heat-dissipating elements to the package. This therefore represents enabling technology that will allow the construction of quad ADSL integrated-circuit line drivers.

Note that it is not necessary to include both positive and negative voltage supplies, as well as a ground, in every application of the invention. In some circuits, for example, only a positive or only a negative power supply would suffice, in which case only the positive or negative power control circuit would need to be included. Alternatively, the negative (or positive) voltage level could form the system "ground," with both power control circuits still included. The configuration will depend on the needs of any given application of the invention. The analysis and functioning of such circuits will be essentially the same as described below; any required changes will be obvious to those skilled in the art of monolithic circuit design.

Preferred Implementation of the Invention

Figure 3:
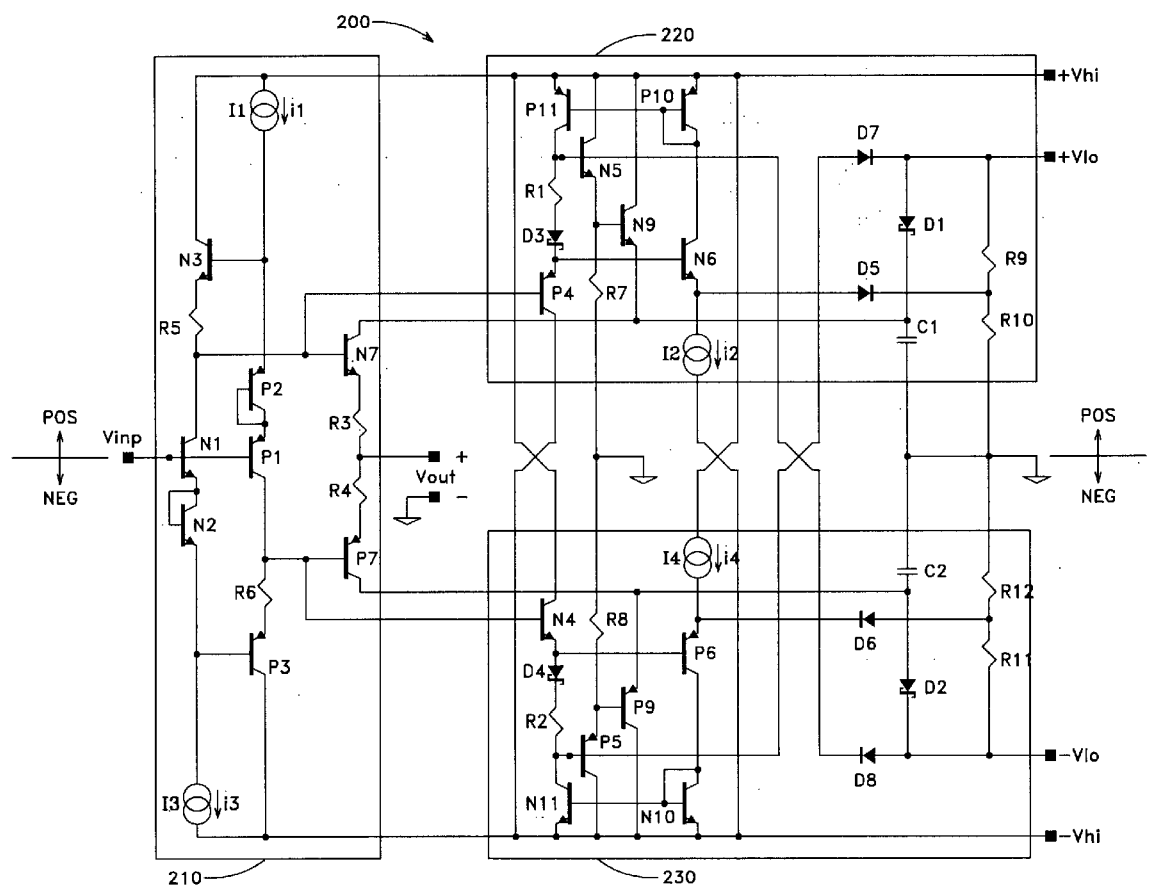
FIG. 3 is a simplified schematic diagram of the output buffer stage with positive and negative power control circuits according to the invention.

FIG. 3 is a simplified schematic diagram of the output buffer stage with positive and negative power control circuits according to the invention. In FIG. 3, conventional monolithic, bipolar NPN and PNP transistors are indicated with reference designations as Nk and Pk, respectively, (k=1, 2, . . . ). Monolithic diodes are indicated with reference designations as Dk, (k=1, 2, . . . ). Diodes D1 and D2 may be conventional PN junction diodes, but are preferably implemented as Schottky diodes while the remaining diodes are conventional PN junction diodes. Conventional current sources and resistors are similarly indicated as ik and Rk, respectively, (k=1, 2, . . . ).

As is well known, the voltage drop (or rise) over a standard PN junction is roughly 600–800 mV, depending on operating parameters such as temperature (and thus on how much current is passing through the junction). All of the transistors used in the preferred embodiment of the invention are preferably fabricated on the same substrate, so that the voltage drop over any junction can be assumed to be nearly the same in magnitude as that over any other junction operating at approximately the same current density. Thus, the base-emitter voltage drop can be assumed to be approximately the same for all transistors operating at approximately the same current density in the invention. The conventional fabrication process for monolithic circuits such as the bipolar amplifier of this invention will almost always justify this assumption. In the rare cases when it does not, then the necessary changes to the circuitry of the invention will be obvious to those skilled in art, especially in light of the description of the various voltage levels (and their relationships) created within the preferred embodiment of the invention, and how they are used.

In the following description, the magnitude of the junction voltage drop is referred to as a constant, D. It is to be understood, however, that D is actually a function of, among other things, current density and temperature. However, any differences in D for devices at approximately the same current density or temperature will in general be either negligible or irrelevant to the operation of the circuit.

The circuit as shown in FIG. 3 is divided into a positive "side" (labeled POS, above the dash-dotted line) and a negative "side" (labeled NEG, below the dash-dotted line). This is for ease of understanding only, since the two different portions of the circuit have identical or functionally identical components and connections, and operate identically, except for reverse polarities of supply voltages and bipolar components. Thus, for each transistor NPN transistor on the positive side, there is a corresponding transistor PNP transistor on the negative side, and vice versa. For example, N9 corresponds to P9, P2 corresponds to N2, and so on. The analysis of the NEG side of the circuit can thus be done in exactly the same way as for the POS side described in detail below.

The connections of the various components shown in FIG. 3 for the preferred embodiment of the invention are as follows. The input voltage signal Vinp is connected to the base of two different input transistors N1 and P1.

On the positive side of the circuit, the relatively higher positive voltage supply +Vhi is connected to the collectors of transistors N3, N5, and N9, and also supplies current sources I1 and I4, which generate currents i1 and i4, respectively. Voltage +Vhi also supplies current to the emitters of transistors P10 and P11 which comprise a conventional bipolar current mirror, with P10 as input and P11 as output, bases connected together and P10 base connected to P10 collector.

The relatively lower positive voltage supply +Vlo is connected to the anode of diode D1, which supplies current to a regulator bus in a first mode of operation. D1 may be a conventional PN junction diode, or may preferably be replaced by a Schottky diode in the preferred embodiment of the invention in order to reduce forward voltage drop in comparison to a standard PN junction diode.

Voltage +Vlo is also connected to the cathode of standard PN junction diode D7, which has its anode connected to the base of P5. During a positive voltage excursion, the emitter of P5 can rise no higher than ground because its bias current supply is fed from ground through resistor R8. In one prototype of the invention, R8 and R7 were both chosen to be approximately 10K, thereby providing a bias current of approximately 500 microamps at the switch-over threshold.

By connecting the anode of D7 to the base of P5, reverse base-emitter voltage breakdown is prevented in P5 because the base of P5 is clamped to +Vlo by D7. The maximum current through D7 is limited by R2. Transistor P5, resistor R8 and resistor R2 and their connections correspond to those of transistor N5, resistor R7 and resistor R1 in the positive power control circuit.

The collector of N1 is connected, via a resistor R5, to the emitter of N3, and, directly, to the base of N7. The output of the current source I1 is connected directly to the base of N3 and to the emitter of P2. Transistor P2 is diode-connected, that is, its base and collector are connected. The base/collector of P2 are connected to the emitter of P1.

The transistor N3 is, as FIG. 3 shows, preferably connected as an emitter follower driving the output transistor N7 and a power control input buffer transistor P4 though R5. The N3 base is connected, via the diode-coupled transistor P2, to the emitter of P1. Relative to the input signal Vinp, the N3 base voltage will be roughly two base-emitter voltage drops (approximately 1.4 V) higher, which is a suitable level for driving the output transistor N7.

The base voltage of N7 is suitable for driving the base of P4, which is the input buffer transistor for the first or high-voltage section of the positive power control circuit.

Within the positive power control circuit 220, a second current source I2 is connected to the emitter of N6, to the anode of D5, and passes through the emitter-collector circuit of N6 to the joined base and collector terminals of P10. P10 is the input stage of a PNP current mirror that mirrors the collector current, approximately equal to i2 at low voltages, up through the positive supply and back down through output stage P11 to the junction of R1, base of N5 and cathode of a diode D8. The current source i2, preferably a small value such as 100 uA, after being mirrored through P10 and P11, maintains the forward-biased diode drop of Schottky diode D3 near approximately 300 mV, even though output voltage may be low and diode D5 may not be conducting. I2 also produces a small voltage drop, less than approximately 30 mV, across R1 when R1 is preferably a small value such as 270 ohms. The quiescent voltage drive to the base of N5 is therefore approximately one conventional base-emitter diode drop and one Schottky diode drop above the power control circuit input voltage, that is, at the base of P4. This is because there is a base-emitter drop from the base of P4 to the emitter of P4, and the emitter of P4 is connected to the cathode of diode D3. D3 may be a conventional PN junction diode, but is preferably a Schottky diode, which has approximately half of a conventional silicon diode voltage rise to the anode of D3; D3 is connected to the base of N5 through R1.

Because one objective of the invention is to increase the voltage drop from the collector of N7 to the emitter of N7 dynamically, as the output voltage rises, it is necessary to increase the voltage drop from the base of N4 to the base of P4 as the output voltage rises. This increase is provided by increasing the I*R drop across R1 as the output voltage rises. Such increase is a result of current being conducted from the junction of resistors R9 and R10, through the cathode of diode D5, to the emitter of N6 with increasing output voltage. The voltage at which conduction through D1 begins can be set by adjusting the ratio of resistors R9 and R10 as a conventional voltage divider from +Vlo to ground. The peak magnitude of the current may be set by adjusting the resistor magnitudes of R9 and R10 up or down, but in the same ratio that gives the desired start of voltage conduction. In this example R9 is 2K and is connected to +Vlo while R10 is 3K and is connected to ground, resulting in conduction through the cathode of D5 at a voltage of approximately 3V at the junction of R9 and R10 with +Vlo=5V. R11 and R12 are preferably set equal to the value of R9 and R10 respectively.

The Thevenin equivalent resistor value of R9 and R10 is well known to be the value of R9 and R10 in parallel, or approximately 1.2K. The voltage rise from output to base of N7 and then to emitter of P4 is approximately equal to the drop from the base to emitter of N6 and across diode D5. When the output voltage is approximately 9 volts, there is the difference of approximately 6V across the Thevinin equivalent resistance of approximately 1.2K and a resulting increase in bias current across R1 to a IR maximum of approximately 5 mA. This increase in current provides an increase in drive voltage to N5, and a corresponding increase in N7 headroom of approximately 1V.

Transistors N5 and N9 are connected in a conventional Darlington configuration with both collectors connected to +Vhi and the emitter of N5 connected to the base of N9. The emitter of N9 and the cathode of D1 are both connected to the collector of the driver output stage N7. The connection of the N9 emitter, D1 cathode and N7 collector forms a positive portion of a regulator bus, or, in short, a "positive regulator bus." This is important to note, since N9 and D1 are the devices through which the respective high and low positive power supplies +Vhi and +Vlo are connected to the regulator bus, and thus to the collector of the output transistor N7.

P4 is the input buffer transistor for the positive power control circuit with output devices N9 and D1 form analog switching or regulating elements controlling the amount of current drawn from +Vhi and +Vlo, respectively.

Note, however, that even though the collector of N7 is connected to the positive regulator bus and thus receives current drawn from either +Vhi or +Vlo, all current to the base of N7 is drawn exclusively from the relatively higher supply +Vhi, which is the sole voltage source for the buffer stage 210. The collector and emitter of the output transistor N7 thus form input and output terminals, respectively. The input terminal is connected to the "switched" power supply, whereas the base of N7, which forms a current control terminal, receives its control current through N3 solely from the single, unswitched, stable source +Vhi.

The collector of P4 is connected to the negative −Vhi power supply, while the collector of N4 is connected to the positive +Vhi supply.

Finally, the emitter of N7 is connected, via a resistor R3 to a positive output terminal Vout, whose negative terminal is circuit ground. This resistor R3 is preferably included to reduce the quiescent bias current through N7, and can be adjusted to reduce second harmonic distortion. It will typically have a very small value—in one prototype of the invention, R3 had a value of only 0.2 Ohms. Note that the value for the compensation resistor R6 for the PNP transistor P7 may be somewhat different than that needed for the resistor R5 associated with an NPN transistor such as N7. In the same prototype of the invention, the resistor R4 had a slightly smaller value than R3, that is, 0.1 Ohms. The proper values for R3 and R4 can be determined using design methods that will be discussed later with regard to reducing second harmonic distortion.

The connections of the various voltage supplies, current sources, and components on the negative side of the circuit are "mirrored" with respect to those on the positive side, but with reverse polarities. The exact connections are therefore not described separately.

Yet another advantageous feature of the invention is to increase the amplifier power efficiency by increasing the switch-over threshold voltage. The switch-over threshold is increased by providing low headroom for the output stage at switch-over and then increasing headroom dynamically as output voltages increase beyond the switch-over threshold. This enables dynamic headroom control for the output stage transistor N7. Increasing the switch-over threshold voltage increases power efficiency because current is supplied to output stage transistor N7 over a higher portion of the output duty cycle than would be the case for a lower switch-over voltage.

In order to simplify the explanation of this feature of the invention, assume the following notation:

VN7ce is the collector-to-emitter voltage on the output transistor N7;

DNi is the voltage drop (the "diode drop") from the base to the emitter of transistor Ni;

DPi is, similarly, the voltage or "diode" drop from the base to the emitter of Pi; and VR1 is the voltage drop from the top to the bottom of resistor R1.

The nature of these voltage drops is well understood in the field of bipolar design.

Now because N7 is an output transistor, its base-emitter diode drop DN7 gets to be quite large when N7 is driving a very high current. Part of the reason for this is that N7, as is typical for a bipolar transistor, may include a hundred Ohms of base resistance and may conduct three or four milliamps of base current; this leads to an increase in the external base-emitter voltage of N7 having a total drop approaching approximately 1.2 V, that is, a little more than the 800 mV intrinsic base-emitter diode drop.

Note, however, that in the embodiment of the invention shown in FIG. 3, the base-emitter diode drop for whichever switch transistor is "active" (conducting), that is, the voltage rise DN9 for N9, will be comparable to the drop DN7. Likewise, the voltage rise of DP4 for P4 will be comparable to the drop DN5.

While the voltage rises and drops described above tend to cancel, there are two components—D3 and R1—that have been designed into the circuit of the preferred embodiment of the invention in order to provide voltage rises not countered by voltage drops.

The voltage rise VD3 provided by Schottky diode D3 is approximately 0.3V at currents of a few mA and is not compensated by corresponding NPN transistor drops.

This increases the headroom, or voltage from the emitter of N9 (collector or N7) to the emitter of N7.

The voltage rise provided by resistor R1 is variable, and in proportion to the current passed by P-mirror output device P11. The P11 current is established by the P-mirror input current through N6. N6 has a small continuous bias current, but as the N6 emitter voltage rises to a value sufficient to forward bias D5, the N6 (and P11) current increases as the output voltage rises and D5 current increases.

In order to better understand the general circuit concepts employed, consider now the two different signal paths from the emitter of N7 to the collector of N7. Note that the one path is via Schottky diode D1, which controls the connection of the +5V (+Vlo) lower power supply to the output transistor N7, while the other path is via N9, which controls the connection of the higher power supply +Vhi to the output transistor N7.

In the low-power control path, the headroom is just the difference between the low voltage supply +Vlo, reduced by the Schottky Diode drop VDS1, and the output emitter voltage VeN7. The voltage change at each step, and the approximate total voltage change (headroom VN7ce) are as follows.

| Path | Voltage change |
| --- | --- |
| Difference between +Vlo supply and N7 emitter | +Vlo −VeN7 |
| from the anode to the cathode of Diode D1 | −VDS1 |
| Total Voltage Change Over Whole Low-Power Path*: | +Vlo −VDS1 −VeN7 |

*(Headroom VN7ce: from the N7 emitter to the N7 collector)

From the Total Voltage Change result it can be seen that as the output emitter voltage VeN7 rises to within a Schottky diode voltage drop VDS below the low voltage supply +Vlo, the headroom drops to zero. If no other source of collector voltage were present as the N7 headroom dropped near zero, the device would go into saturation (both base-collector and base-emitter diodes becoming forward biased). Current from the high voltage path must therefore be provided before this condition occurs.

For the high-power control path, the approximation can be made that DN7=DN9, and that DP4=DN5, since any differences will be small enough to be negligible, even over large output current ranges. Assuming that the P11 and N6 currents (IP11 and IN6) are approximately equal, the voltage drop across R1 is approximately R1*IN6. The high-power control path, the voltage change at each step, and the approximate total voltage change (headroom VN7ce) are as follows:

| Path | Voltage change |
| --- | --- |
| from the emitter to the base of N7, | +D |
| from the base to transistor emitter of P4 | +D |
| from the anode to cathode of diode D3 | +VDS3 |
| from the top to the bottom of resistor R1 | +(R1*IN6) |
| from the base to the emitter of N5, | −D |
| from the base to the emitter of N9 | −D |
| Total Voltage Change Over Whole High-Power Path*: | +VDS3 + (R1*IN6) |

*(Headroom VN7ce: from the N7 emitter to the N7 collector)

In the illustrated, preferred embodiment of the invention, the voltage change over the high-power control path is therefore VN7ceH=+VDS3+(R1*IN6) and the voltage change over the low-power control path is VN7ceL=+Vlo−VDS1−VeN7.

For high VeN7 output voltages, IN6 will increase and the headroom will dynamically increase with output voltage as R1*1N6 increases. For low VeN7 output voltages, as voltage VeN7 increases toward +Vlo, the headroom VN7ceL collapses toward zero, but does not go to zero because the high-power control path circuitry takes over the supply of current to N7. The high-power control path circuitry thus forms a second switching arrangement that attempts to supply an increasing headroom VN7ceH.

At the switch-over point VN7ceH, the high-power control path headroom will be approximately equal to the low power path headroom VN7ceL, that is, VN7ceH =VN7ceL. Using the relationships previously obtained for VN7ceH and VN7ceL and substituting them in the last equality we obtain +VDS3+(R1*1N6)=+Vlo−VDS1−VeN7. Rewriting the last relationship yields the output voltage VeN7 at switch-over as +Vlo−VDS1−VDS3−(R1*IN6). Assuming that, at switch-over, a) the DS1 Schottky diode is supplying half the load current and has a voltage drop of approximately 0.4V; b) the DS3 Schottky diode voltage is approximately 0.3V; and c) the R1*IN6 voltage is approximately 0.3V at the low IN6 current corresponding to switch-over, then the switch-over voltage at VN7e is approximately +Vlo−1V, or 1 volt below the low voltage supply voltage.

The object of the invention of providing a dynamic increase of headroom voltage with increasing output voltage may be accomplished by increasing IN6, that is, the current through N6, with increasing output voltage. One way of providing an increase in IN6 is to set the voltage (R1*IN6) to be approximately 0.3V at switch-over and approximately 1.2V at the full output voltage of approximately 8.5V. Assuming the Schottky diode D3 voltage is approximately 0.3V, then the total voltage across DS3 and R1 would be 0.6V at switch-over and 1.5V at full output.

The conditions described above may be achieved by selecting R1 to be 270 Ohms and providing an N6 current at switch-over and full output of approximately 1 mA and 4.5 mA, respectively. An R1 current of approximately 4.5 mA provides a voltage drop of 4.5*270=1.2V at full output, provided that the N6 base current is less than 100 uA. An R1 current of approximately 1 mA at switch-over provides a voltage drop of 0.001*270=270 mV.

The resistor combination R9 and R10 may be selected to provide the required N6 current at switch-over and at full output. To compute the required resistor values, the relationship between the output voltage, or approximately the voltage at the emitter of the output driver VeN7, must be known and preferably not be driven to excessive differences with temperature.

In order to better understand the general circuit concepts employed to maintain the voltage difference between the output driver emitter VeN7 and the cathode voltage VcD5 of diode D5, consider the path from the emitter of N7 to the cathode of D5: For the path from the cathode of D5 to the base of N6, the diode drops across D5 and N6 will be fairly well matched once the D5 current has risen to the range above a few hundred microamps. These drops will also closely match the P4 diode drop and therefore all three drops can be characterized approximately by the value D.

The voltage drop near switch-over is of primary concern because the D5 current at switch-over determines, in conjunction with the value of resistor R1, the voltage rise across R1 as discussed previously. The base-emitter drop of N7 will be within one or two hundred mV of the value D at switch-over, but may rise to several hundred mV above switch-over at maximum voltage output. The base-emitter drop of N7 may be approximately characterized by the value D at switch-over, but for now it will be given the value DN7 in the table below:

The D5 (and R1) current control path, the voltage change at each step, and the approximate total voltage change (difference between VeN7 and VcD5) are as follows:

| Path | Voltage change |
|---|---|
| from the emitter to base of transistor N7 | +DN7 |
| from the base to emitter of transistor P4 | +D |
| from the base to emitter of transistor N6 | −D |
| from the anode to cathode of D5 | −D |
| Total Voltage Change Over Whole Path*: | +DN7 −D |

*(Voltage rise from N7 emitter VeN7 to D5 cathode VcD5)

The above analysis indicates that the cathode voltage of D5 will track the emitter voltage of N7 well, because the difference +Dn7−D will be less than a few hundred millivolts at voltage switch-over. Of primary importance is that the silicon diode temperature coefficients of approximately 2.2 mV per degree Celsius tend to cancel out in the difference +Dn7−D. The voltage rise from the N7 emitter to D5 cathode will therefore be relatively temperature-independent. Note that the fact that there is an additional rise at high currents because the DN7 voltage may exceed D by five to seven hundred millivolts does not detract from circuit performance: This rise is determined primarily by voltage drops in N7, which are reasonably uniform and predictable from one integrated circuit to the next and have a small, but predictable, impact on choosing the maximum D5 current setting corresponding to peak voltage output.

By means of simple choices for R1 and the Thevenin voltage and parallel resistance of R9 and R10, the proper dynamic headroom control conditions for the circuit can be precisely defined from switch-over to maximum output voltage. The ratio of R9 to R10 is chosen to provide the proper Thevenin voltage facing D5 and the individual resistance values are chosen to provide the appropriate current through D5 by setting the value of the parallel, or Thevenin equivalent resistance. These choices may be made using normal design criteria.

One advantageous feature of this invention is that the voltage difference between the N7 emitter voltage and the D5 cathode voltage is small at switch-over. Thanks to this feature, it is easy for anyone skilled in the art to select values for resistors R1, R9 and R10. Resistors R9 and R10 must be chosen, in connection with R1, to provide the proper voltage drop both at voltage switch-over and at maximum driver output voltage. These choices are made simple by observing that if, as in this example, the switch-over voltage is approximately 4V at the driver output, then the voltage at switch-over will be approximately 4V at the cathode of diode D5 and at maximum voltage VeN7 at the emitter of N7, the cathode voltage is approximately 9V.

Precise control of the dynamic increase in headroom voltage with driver output voltage is provided by setting the ratio of switch-over current to maximum current through R1. The current through D5 at switch-over or maximum driver output is approximately proportional to the difference between the switch-over voltage or maximum driver output voltage and the R9/R10 divider Thevenin voltage, respectively. This Thevinin voltage is set by determining the R9/R10 divider ratio.

Precise control of the D5 current at switch over is set by adjusting the Thevenin resistance of the R9–R10 parallel combination to the value required, given the difference between the D5 cathode voltage at switch-over and the Thevenin voltage, which will have been determined previously by the R9/R10 divider ratio.

To provide an illustrative example of the dynamic headroom control provided by the invention, assume that it is desired to provide a voltage drop of 0.2V across R1 from D5 current at switch-over and a voltage drop of 1.2V at maximum voltage output. This is a 6:1 dynamic variation in current.

The N6 current at switch-over establishes the dynamic emitter resistance of P4 at switch-over, which should be kept low. If the R9/R10 ratio is to be 2:3 to establish the required Thevinin voltage, then a value of R9=2K and R10=3K will provide a parallel resistance, or Thevenin resistance, of 1.2K. Given a 1V difference between D5 cathode voltage of 4V and a 3V R9/R10 ratio, the current through R1 would be approximately 0.83 mA from the resistive divider. At maximum output, the voltage difference would be approximately 9V−3V=6V across 1.2K, giving a current of 5 mA. This current ratio is just the same as the ratio of voltage differences, or the 6:1 ratio desired. Setting R1 to provide a voltage drop of slightly higher than 1.2V at maximum output would require an R1 value of approximately 270 ohms. The voltage drop across R1 at switch-over would be determined by the sum of the 0.8 mA from the divider and the 0.1 mA from the I2 bias generator. The voltage drop across R1 at switch-over would then be approximately 0.3V.

Figure 4:
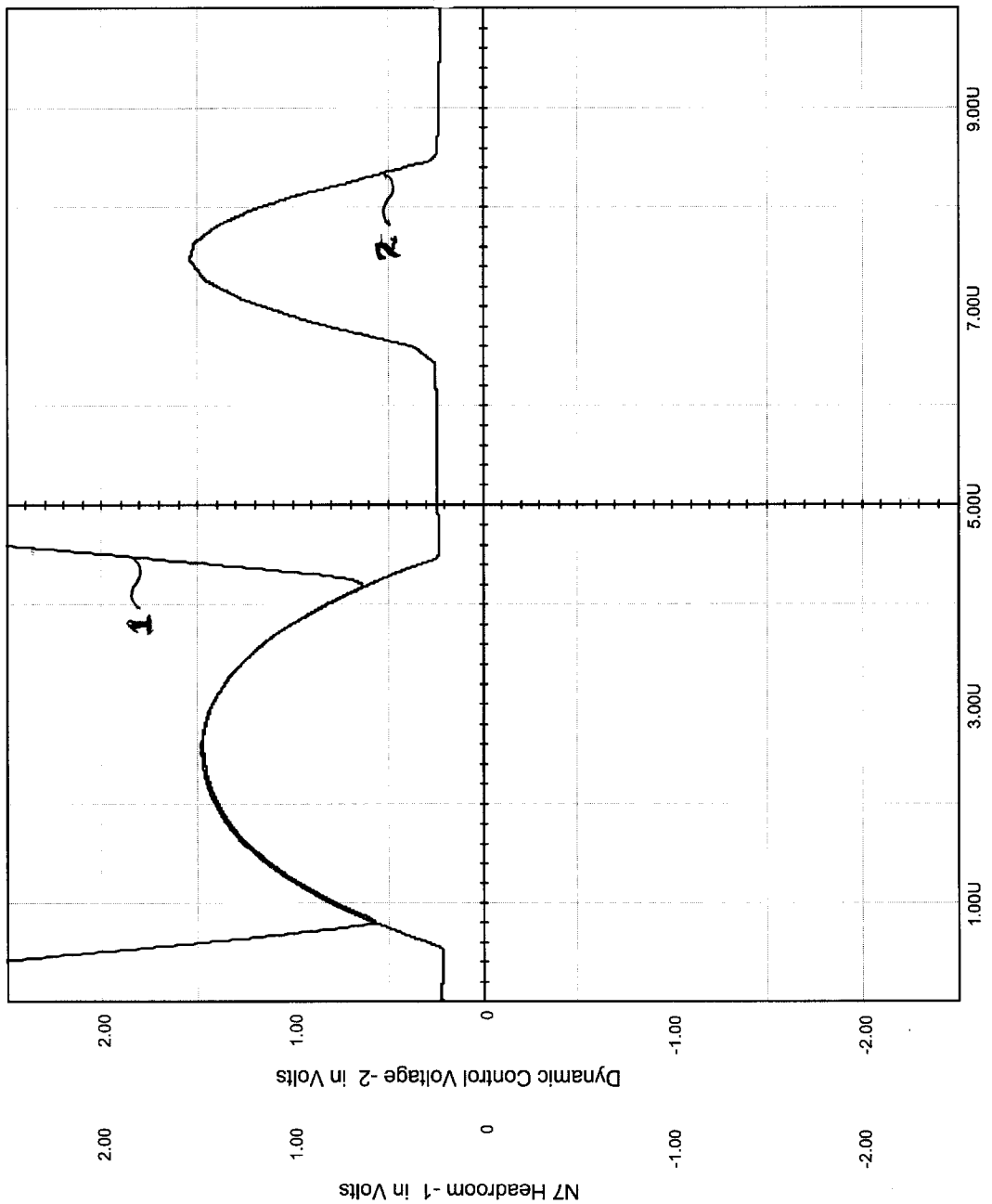
FIG. 4 is a plot of the dynamic headroom control voltage and the N7 output driver headroom voltage vs. time.

If a Schottky diode is used for D3, then the voltage might be approximately 0.3V. In this example the headroom would be the sum of the voltage drops across diode D3 and resistor R1, which is slightly in excess of 0.6V at switch-over and approximately 1.5V at maximum output. A plot of the dynamic headroom control voltage for a sinusoidal output voltage of 8.5V may be seen in FIG. 4. As this figure shows, the dynamic control voltage (sum of voltage across D3 and R1) increases from approximately 0.3V to approximately 1.5V at maximum output. The N7 headroom, as measured by the difference in N7 collector-to-emitter voltage is also shown in the same plot. Headroom falls as output voltage rises toward +Vlo. After switch-over, the headroom rises smoothly to 1.5V maximum as the power control circuit delivers current from the +Vhi supply under precise control from the voltage developed across the series combination of D3 and R1.

Other combinations of R1, R9 and R10 values may be easily chosen to accommodate other desired dynamic headroom control parameters. One might, for example, choose to provide a greater or smaller increase the ratio of headroom at full output to switch-over. The approximately constant voltage across diode D3 may be optionally increased by replacing it with a conventional PN junction silicon diode or, conversely, reduced to this voltage to zero by shorting it out. Note that a small, perhaps off-chip capacitor C1 (and C2) has been shown in FIG. 3 to provide a low-impedance path from the collectors of the output drivers N7 and P7 to ground. In one prototype of the invention, the value of C1 (and C2) was chosen to be 100 pF, but the circuit operates satisfactorily with higher and lower values. As with choices of R1, R9 and R10, the value of C1 required can be determined according to the characteristics of the transistors used in accordance with principles well known to those skilled in the art.

This implementation of the invention also has advantages from the standpoint of fabrication. In the preferred embodiment of the invention, the designs of N3 and N7 are different in that they may be constructed with different multiples of drain sinker fingers. As is well known in the art, in designing monolithic bipolar ICs, one usually wishes to maintain about the same maximum current density in each device. The maximum current for N7 will normally be about 360 mA, or about 180 mA if active termination techniques are used. This means that N7 is preferably implemented using two devices of 34 collector fingers each. On the other hand, the driver N3 is preferably constructed from just a single one-finger device, since it has to handle only about 1/100 of the output current, that is, about 2–3 mA maximum. This practice is well understood in the art—in bipolar design, one includes just enough multiples of the output N7 or source-follower driver N3 device emitter, collector, and sinker fingers to assure proper maximum current density and voltage drops.

Note an additional advantage of the preferred implementation of the invention: Even if N7, P7, N9, and P9 and P10 are fabricated with many fingers (more than 60), then all the other transistors may have just one.

If either one of the transistor pairs N3/N7 or P3/P7 is stronger than the other, then it will require less base voltage at either the base of N3 or P3 to drive the output to the same current in each direction. In other words, for equal drive voltages at the bases, the output may rise to a higher potential in one polarity. This will result in output waveform distortion commonly known as second harmonic distortion. Resistors R3 and R4 may then be adjusted in value, using known techniques, to compensate for such harmonic distortion, which results from small differences in the emitter resistances of N7 and N8 respectively. Similarly, resistors R5 and R6 may be adjusted in value using known techniques and design considerations to compensate for small differences in the base resistances of N7 and N8, respectively. As would be apparent to one skilled in the art, increasing the value of the corresponding resistor can compensate lower values of emitter or base resistance.

A power control circuit that did not incorporate dynamic adjustment of headroom and operated with a fixed headroom control would have to provide as much headroom at switch-over as at maximum driver output voltage. For a 5V first, or lower-voltage supply, this might require the switch-over voltage to be fixed somewhere within the range of 3 to 3.5 V. A higher switch-over voltage, such as 4V will allow the power control circuit to provide current over a larger portion of the duty cycle from the first, or more power-efficient voltage supply.

In order to integrate multiple amplifiers into one semiconductor chip and without requiring complicated and difficult-to-implement heat dissipation mechanisms, the total power dissipation, excluding power delivered to the load, should not exceed a total of 2.2 watts, or 550 mW per amplifier. For ADSL applications, load power will be 100 mW and therefore total amplifier input power may not exceed 650 mW.

Figure 5:
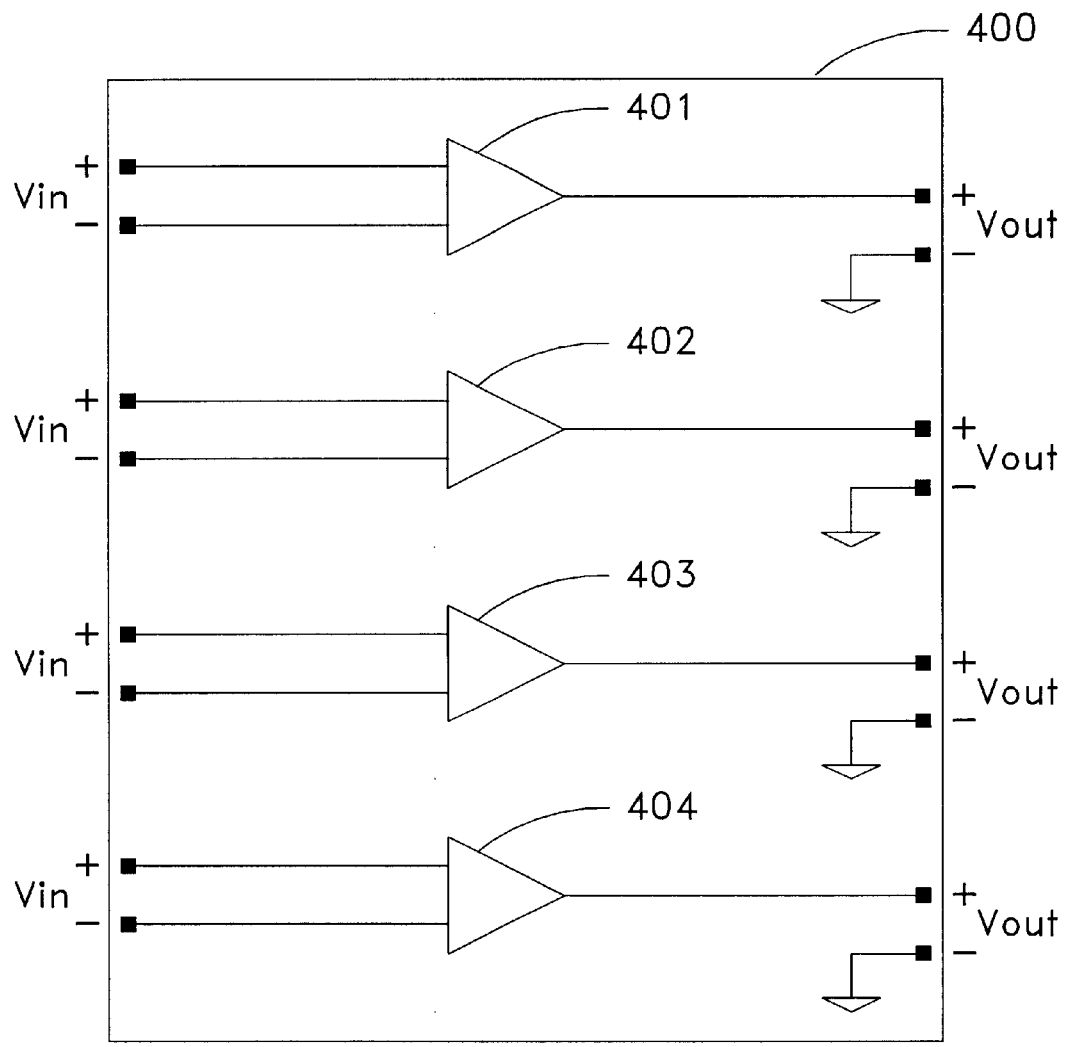
FIG. 5 illustrates four IC line drivers combined in a single device, which this invention makes possible.

By maximizing the driver stage output at voltage switch-over, the arrangement according to the invention thereby wastes very little of the supply current from the second voltage supply. The invention thereby minimizes the total power consumed from circuit package. This is illustrated in FIG. 5, which is a simplified diagram of an integrated circuit including four amplifiers 401, 402, 403, 404 according to this invention integrated into a single semiconductor chip 400, that is, fabricated on a common substrate and in a common package. Each of the amplifiers will have the same structure and function as the amplifier 200 shown in FIG. 3.

The layout area required by the power devices must not be excessive; otherwise fabrication of the integrated circuit will not be economical. A key to small area requirements for each amplifier output stage and thus to enabling the combination of up to four drivers within a single IC is that the driver collector resistance should not be too low. For example, if the driver N7 collector resistance is 10 ohms, then the layout area requirements will not be excessive; with a peak current of 100 mA, however, the collector resistance voltage drop will be 100 mA×10 ohms for a total of 1V. If the circuit provides a total of approximately 1.5V of headroom at peak current output, then there will still remain approximately 0.5V across the internal collector to emitter junction.

Because this invention enables collector voltage at the output stage to be dynamically controlled to be greater than the emitter voltage by a difference voltage that increases proportionally as output voltage increases above the switch-over threshold, the extra 1V of headroom can be provided to keep driver area requirements down without causing that same extra 1V of headroom to impair output efficiency by lowering switch-over voltage by 1V. This combination of low power dissipation and low integrated circuit areas is essential to achieving higher levels of integration in bipolar output drivers for telecommunications applications.

In the discussion of the invention above, the various transistors N1–N11 and P1–P11 are all described and illustrated as bipolar devices, in which the respective emitters and collectors function as first and second current terminals and their respective bases function as current control terminals. Components indicated as diodes may be replaced by diodes of alternative constructions, such as by diode-connected bipolar transistors, conventional silicon diodes, or Schottky diodes, for example. These concepts are well known in the art of bipolar design. The invention can also be implemented, however, using other semiconductor technologies besides bipolar. For example, if the transistors are implemented in MOS technology, such as FET transistors, then the current terminals of each transistor would be the source and drain, corresponding to the bipolar emitter and collector, and the current control terminal would be the gate, corresponding to the bipolar base. Modifications of the rest of the amplifier according to the invention will then be made using known design techniques.

I claim:

1. A monolithic integrated circuit amplifier having an amplifier input signal and an amplifier output signal comprising:
   a gain stage that has a gain stage output signal and has, as an input, the amplifier input signal;
   an output buffer stage having, as its output signal, the amplifier output signal, as its input signal, the gain stage output signal, and having at least a first power output transistor, which has first and second current terminals and a current control terminal;
   a first and a second voltage supply, the second voltage supply having a relatively higher magnitude than the first;
   a first power control circuit connected to both the first and second voltage supplies, and to the output buffer stage through a regulator bus;
   the first power control circuit including:
      first control path circuitry connected between the first voltage supply and the regulator bus; and
      second switching circuit control path circuitry connected between the second voltage supply and the regulator bus;
   in which:
   when an output demand voltage is less than a predetermined switch-over threshold:
      current to the output buffer stage is provided substantially from the first voltage supply via the first control path circuitry; and
      the voltage on the regulator bus itself substantially blocks current output from the second control path circuitry; and
   when the output demand voltage is greater than the switch-over threshold:
      current to the output buffer stage is provided substantially from the second voltage supply, via the second control path; and
      the second control path circuitry provides, via the regulator bus, a headroom voltage over the output transistor that increases gradually with increasing output voltage up to a maximum amount at a maximum output voltage, the headroom voltage being defined as the voltage difference between a second current terminal of the output transistor and a first current terminal of the output transistor, the second current terminal being connected to the regulator bus; and
      the voltage on the regulator bus itself substantially blocks current output from the first control path circuitry.

2. The amplifier as defined in claim 1, further comprising:
   an output voltage detecting means for detecting the amplifier output signal voltage and converting it into a first current; and
   a current coupling means for receiving the first current and providing a current to a voltage shifting means that is proportional to the first current, the voltage shifting means being provided for receiving the current signal from the current coupling means and converting the current into a voltage headroom control voltage.

3. The amplifier as defined in claim 2, in which the output voltage detecting means includes an output voltage threshold means for establishing a voltage threshold above which the first current output from the output voltage detecting means increases with output voltage.

4. The amplifier as defined in claim 2, in which the current coupling means includes a current mirror.

5. The amplifier as defined in claim 2, in which the voltage shifting means includes at least one resistor that converts the current signal from the current coupling means to a portion of the control voltage that is proportional to the current signal.

6. The amplifier as defined in claim 2, in which the voltage shifting means includes at least one diode that converts the current signal from the current coupling means to a portion of the control voltage that is substantially constant with variations in the current signal.

7. The amplifier as defined in claim 1, in which:
   the first and second voltage supplies comprise a first dual voltage supply:
   the regulator bus connecting the first dual voltage supply to the output stage via the first power control circuit is a first regulator bus;
   the amplifier further comprising:
      a second dual voltage supply, including third and fourth voltage supplies having the same amplitudes but opposite polarity relative to the first and second voltage supplies, respectively; and
      a second power control circuit having the substantially identical components and connections but opposite polarities relative to the first power control circuit.

8. A method for controlling an output buffer stage of a monolithic integrated circuit amplifier that includes a first, lower voltage power supply and a second, higher voltage power supply, comprising the following steps:
   providing a first current to the output buffer stage substantially wholly from the first voltage supply when an output demand voltage is less than a predetermined switch-over threshold;
   providing a second current to the output buffer stage substantially wholly from the second voltage supply when the output demand voltage is greater than the switch-over threshold; and
   providing a voltage at a second current terminal of the output buffer stage that is greater than the voltage at a first current terminal of the output buffer stage by a controlled headroom voltage at and above a switch-over voltage, said headroom voltage increasing gradually with increasing output voltage up to a maximum amount at maximum output voltage, thereby dynamically controlling the voltage headroom of the output buffer stage, that is, the voltage difference between the first and second current terminals.

9. A method as described in claim 8, further including the following steps:
   detecting an output voltage of the output buffer stage; and
   converting the detected output voltage it into a third current that increases as the output voltage of the output buffer stage increases above a predetermined threshold voltage;
   coupling the third current into a voltage shifting means;
   applying the voltage from the voltage shifting means to a control terminal in the second voltage supply that controls the voltage headroom of the output buffer stage, that is, the voltage difference between the first and second control terminals.

10. A method as in claim 9, in which:
    the step of coupling the third current to the voltage shifting means includes connecting the first current to the voltage shifting means through a current mirror; and
    the step of converting the current signal from the current coupling means to a portion of the headroom control Voltage includes passing the current through a resistor.

11. A method as in claim 9, in which the step of converting the current signal from the current coupling means to a portion of the headroom control voltage includes passing the current through a silicon diode.

12. A monolithic integrated circuit amplifier having an amplifier input signal and an amplifier output signal comprising:
   a gain stage that has a gain stage output signal and has, as an input, the amplifier input signal;
   an output buffer stage having, as its output signal the amplifier output signal, as its input signal, the gain stage output signal; and having at least a first power output transistor, which has first and second current terminals and a current control terminal;
   a first and a second voltage supply, the second voltage supply having a relatively higher magnitude than the first;
   a first power control circuit connected to both the first and second voltage supplies, and to the output buffer stage through a regulator bus;
   the first power control circuit including voltage headroom control means for setting a voltage headroom at a switch-over voltage and at the maximum value of the amplifier output signal, the voltage headroom being defined as the voltage available at the second current terminal of the first power output transistor relative to the first current terminal of the first power output transistor;
      first control path circuitry connected between the first voltage supply and the regulator bus; and
      second switching circuit control path circuitry connected between the second voltage supply and the regulator bus;
   in which:
   when an output demand voltage is less than a predetermined switch-over threshold:
      current to the output buffer stage is provided substantially from the first voltage supply via the first control path circuitry; and
      the voltage on the regulator bus itself substantially blocks current output from the second control path circuitry; and
   when the output demand voltage is greater than the switch-over threshold:
      current to the output buffer stage is provided substantially from the second voltage supply, via the second control path circuitry; and
      the voltage headroom increases gradually with increasing output voltage up to a maximum amount at maximum output voltage;
   the voltage on the regulator bus itself substantially blocking current output from the first control path circuitry; and
   the voltage headroom control means includes:
      an output voltage detecting means for detecting the amplifier output signal voltage and for converting the amplifier output signal voltage into a first current;
      an output voltage threshold means for establishing a voltage threshold above which the first current output from the output voltage detecting means increases with output voltage; and
      a current coupling means for receiving the first current and for providing a current to a voltage shifting means that is proportional to the first current;
      the voltage shifting means being provided for receiving the current signal from the current coupling means and for converting the current signal from the current coupling means to a portion of the control voltage that is proportional to the current signal and for converting the current signal into a voltage headroom control voltage.

13. The amplifier as defined in claim 12, in which the current coupling means includes a current mirror.

14. The amplifier as defined in claim 12, in which the voltage shifting means includes at least one diode that converts the current signal from the current coupling means to a portion of the control voltage that is relatively constant with variations in the current signal.

15. The amplifier as defined in claim 12, in which:
   the first and second voltage supplies comprise a first dual voltage supply;
   the regulator bus connecting the first dual voltage supply to the output stage via the first power control circuit is a first regulator bus;
   the amplifier further comprises:
      a second dual voltage supply, including third and fourth voltage supplies having the same amplitudes but opposite polarity relative to the first and second voltage supplies, respectively; and
      a second power control circuit having the substantially identical components and connections but opposite polarities relative to the first power control circuit.

16. An integrated circuit comprising:
   A) a single semiconductor chip;
   B) a plurality of monolithic IC amplifiers fabricated on the single semiconductor chip, each amplifier including:
      i) a gain stage that has a gain stage output signal and has, as an input, an amplifier input signal;
      ii) an output buffer stage having, as its output signal, the amplifier output signal, as its input signal, the gain stage output signal and having at least a first power output transistor, which has:
         a) first and second current terminals controlling the headroom of the output buffer stage, that is, the voltage between the first and second power current terminals, and
         b) a current control terminal;
   C) a first and a second voltage supply, the second voltage supply having a relatively higher magnitude than the first;
   D) a first power control circuit connected to both the first and second voltage supplies, and to the output buffer stage through a regulator bus;
   E) first control path circuitry connected between the first voltage supply and the regulator bus; and
   F) second control path circuitry connected between the second voltage supply and the regulator bus;
   in which:
   when an output demand voltage is less than a predetermined switch-over threshold, current to the output buffer stage is provided substantially from the first voltage supply via the first control path circuitry; and
   when the output demand voltage is greater than the switch-over threshold, current to the output stage is provided substantially from the second voltage supply via the second control path circuitry;
   each amplifier further comprises a respective headroom control means for dynamically controlling a voltage headroom of the output stage, that is, the voltage between the first and second power current terminals, and, as the output demand voltage increases above the switch-over threshold, for increasing the voltage headroom.

* * * * *